(12) United States Patent
Kim et al.

(10) Patent No.: US 9,144,153 B2
(45) Date of Patent: Sep. 22, 2015

(54) METHOD OF MANUFACTURING A FABRIC TYPE CIRCUIT BOARD

(75) Inventors: Ji Eun Kim, Daejeon-si (KR); Bae Sun Kim, Daejeon-si (KR); Yong Ki Son, Daejeon-si (KR); Sung Yong Shin, Daejeon-si (KR); Il Yeon Cho, Daejeon-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 355 days.

(21) Appl. No.: 13/551,911

(22) Filed: Jul. 18, 2012

(65) Prior Publication Data

US 2013/0087369 A1 Apr. 11, 2013

(30) Foreign Application Priority Data

Oct. 5, 2011 (KR) .......................... 10-2011-0101024

(51) Int. Cl.
H05K 3/02 (2006.01)
H05K 3/10 (2006.01)
H05K 1/03 (2006.01)
(Continued)

(52) U.S. Cl.
CPC ................ *H05K 1/038* (2013.01); *H05K 1/141* (2013.01); *H05K 3/368* (2013.01); *H05K 3/403* (2013.01); *H05K 2201/055* (2013.01); *Y10T 29/49155* (2015.01)

(58) Field of Classification Search
CPC ....... H05K 1/038; H05K 3/368; H05K 1/141; H05K 2201/055; H05K 3/403; Y10T 29/49155

USPC ................... 29/830, 831, 846, 847, 851, 852; 174/254, 255, 262; 257/686, 736, 779; 442/205–207, 301
See application file for complete search history.

(56) References Cited

U.S. PATENT DOCUMENTS

| | | | | |
|---|---|---|---|---|
| 6,426,549 | B1 * | 7/2002 | Isaak .............................. | 257/686 |
| 7,144,830 | B2 * | 12/2006 | Hill et al. ....................... | 442/301 |
| 7,757,394 | B2 * | 7/2010 | Watanabe ........................ | 29/852 |

FOREIGN PATENT DOCUMENTS

| | | |
|---|---|---|
| JP | 8-204103 | 8/1996 |
| JP | 2009-147210 | 7/2009 |

(Continued)

OTHER PUBLICATIONS

Korean Office Action issued Apr. 1, 2015 in corresponding Korean Patent Application No. 10-2011-0101024.
(Continued)

*Primary Examiner* — Donghai D Nguyen
(74) *Attorney, Agent, or Firm* — Staas & Halsey LLP

(57) ABSTRACT

A fabric type circuit board in which a conductive pattern is provided both faces of fabrics and a method of manufacturing the same. A fabric type circuit board includes fabrics and a conductive pattern in which extension units folded from one side of the fabrics to another side of the fabrics are formed, wherein the conductive pattern is formed using at least one of a copper film transfer printing scheme, printing, etching, embroidery, and sewing. A method of manufacturing a fabric type circuit board includes forming a conductive pattern, having extension units formed therein, on fabrics, cutting a part of the fabrics on which the conductive pattern is formed, and forming contact surfaces by folding the extension units from one side of the fabrics to another side of the fabrics.

6 Claims, 9 Drawing Sheets

(51) Int. Cl.
  *H05K 1/14* (2006.01)
  *H05K 3/36* (2006.01)
  *H05K 3/40* (2006.01)

(56) References Cited

FOREIGN PATENT DOCUMENTS

| KR | 1999-016047 | 3/1999 |
| KR | 10-0744146 | 8/2007 |
| KR | 10-0889489 | 3/2009 |
| KR | 10-2010-008434 | 7/2010 |
| KR | 10-2010-0098156 | 9/2010 |
| KR | 10-1027312 | 4/2011 |
| KR | 10-2011-0104411 | 9/2011 |

OTHER PUBLICATIONS

Notice of Allowance issued by the Korean Intellectual Property Office on Jul. 29, 2015 in corresponding Korean Patent Application No. 10-2011-0101024.

* cited by examiner (A)

(B)

(A)

(B)

METHOD OF MANUFACTURING A FABRIC TYPE CIRCUIT BOARD

This application claims the benefit of priority of Korean patent Application No. 10-2011-0101024 filed on Oct. 5, 2011, all of which is incorporated by reference in their entirety herein.

BACKGROUND OF THE INVENTION

1. Field of the Invention

The present invention relates to a fabric type circuit board and a method of manufacturing the same and, more particularly, to a fabric type circuit board which may be easily connected to another circuit board and a method of manufacturing the same.

2. Discussion of the Related Art

In general, a fabric type circuit board is included in fabrics or clothes in order to implement an input device or a communication device. The fabric type circuit board may improve the wearing sensation because a conductive pattern is formed on a surface of the fabric type circuit board provided as fabrics, and thus researches and development into the fabric type circuit board continues.

As one of the fabric type circuit boards, there is disclosed Korean Patent Registration No. 10-1027312 (Mar. 30, 2011). The disclosed invention relates to a fabric type printed circuit board in which conductive material is patterned on fabrics.

The disclosed invention relates to technology in which the patterned conductive material is bonded to fabrics by a heat-resistant adhesive film. The disclosed invention, however, is problematic in that it has a poor fine view because the conductive material for the board has a single layer and thus conductive adhesives (i.e., a solder and a conductive bond) for connecting boards are externally exposed. Furthermore, the disclosed invention may be problematic in that flexibility and durability at a connection part are low because the board and the conductive pattern are connected by the conductive adhesive.

SUMMARY OF THE INVENTION

An object of the present invention is to provide a fabric type circuit board in which conductive material is provided on both sides of fabrics and a method of manufacturing the same.

In an aspect, the present invention provides a fabric type circuit board, including fabrics and a conductive pattern in which extension units folded from one side of the fabrics to the other side of the fabrics are formed, wherein the conductive pattern is formed using at least one of a copper film transfer printing scheme, printing, etching, embroidery, and sewing.

In another aspect, the present invention provides a method of manufacturing a fabric type circuit board, including forming a conductive pattern, having extension units formed therein, on fabrics, cutting a part of the fabrics on which the conductive pattern is formed, and forming contact surfaces by folding the extension units from one side of the fabrics to the other side of the fabrics.

The method may further include forming an adhesive surface so that the extension units are easily attached to the other side of the fabrics, before forming the contact surfaces.

The method may further include compressing the conductive pattern and the fabrics having the adhesive surface formed therein.

In yet another aspect, the present invention provides a method of manufacturing a fabric type circuit board, including forming a conductive pattern, having extension units formed therein, to one side of a carrier film, placing fabrics so that the fabrics come in contact with a face where the conductive pattern is formed, and forming contact surfaces by folding the extension units from one side of the fabrics to the other side of the fabrics.

The method of manufacturing a fabric type circuit board may further include forming incision lines in the carrier film so that the carrier film is easily folded to the fabrics, before forming the contact surfaces.

Here, the conductive pattern may be formed by a copper film transfer printing scheme.

The method of manufacturing a fabric type circuit board may further include compressing the carrier film and the fabrics, after forming the contact surfaces.

Here, the fabrics may be thermally compressed in temperature at which the fabrics are not thermally deformed.

The method of manufacturing a fabric type circuit board may further include removing the carrier film from the fabrics, after forming the contact surfaces.

BRIEF DESCRIPTION OF THE DRAWINGS

The accompany drawings, which are included to provide a further understanding of this document and are incorporated on and constitute a part of this specification illustrate embodiments of this document and together with the description serve to explain the principles of this document.

DETAILED DESCRIPTION OF THE EMBODIMENTS

Textile circuit boards and methods of manufacturing the same according to the present invention will be described in detail with reference to the accompanying drawings. In the following embodiments, in order to help understanding of the methods of manufacturing the fabric type circuit boards, a conductive pattern is illustrated as being formed using a copper film transfer printing scheme, but the conductive pattern of the fabric type circuit board according to the present invention may be formed using various methods, such as printing, etching, embroidery, and sewing.

Figure 1A:
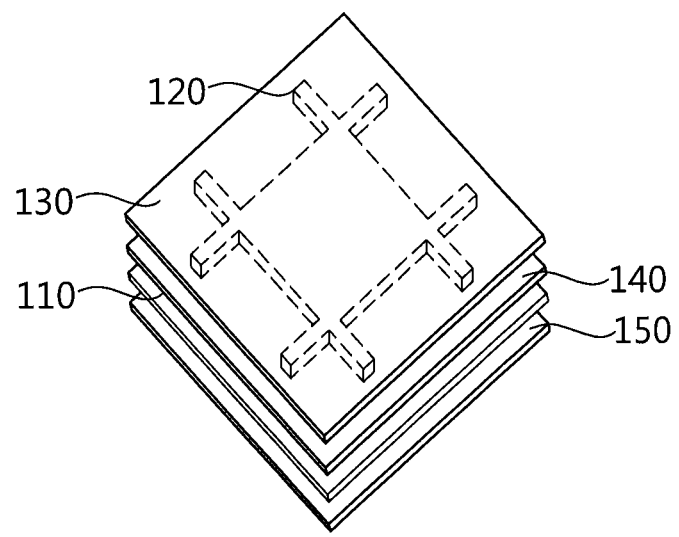
FIG. 1A is a diagram showing a stack step in a method of manufacturing a fabric type circuit board according to a first embodiment.
Figure 1B:
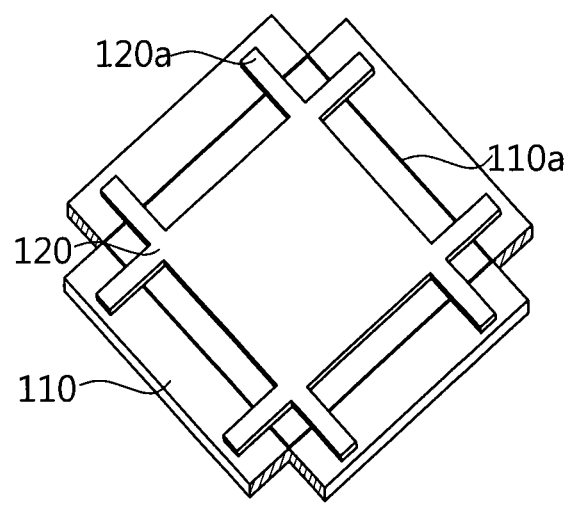
FIG. 1B is a diagram showing a fabric cutting step in the method of manufacturing a fabric type circuit board according to the first embodiment.
Figure 1C:
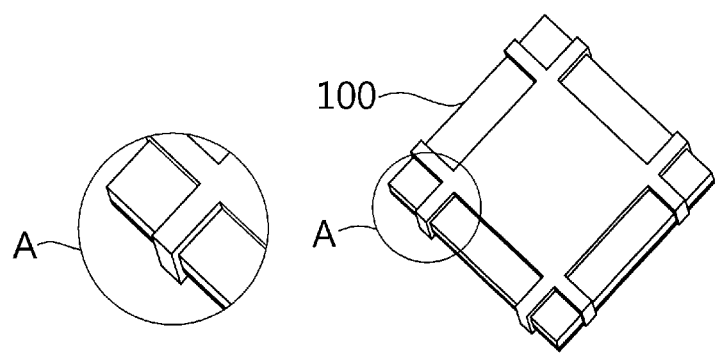
FIG. 1C is a diagram showing a fabric type circuit board according to a first embodiment.
Figure 1C:
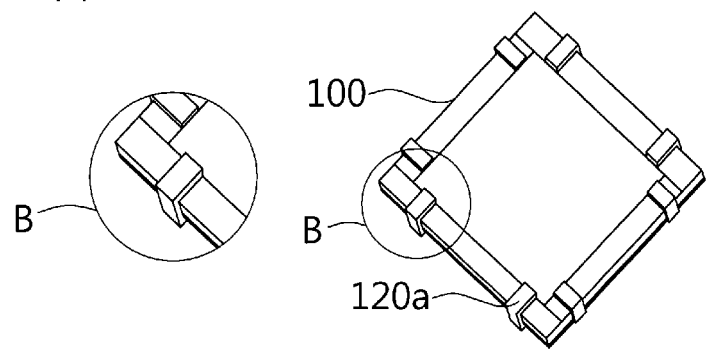
Figure 2:
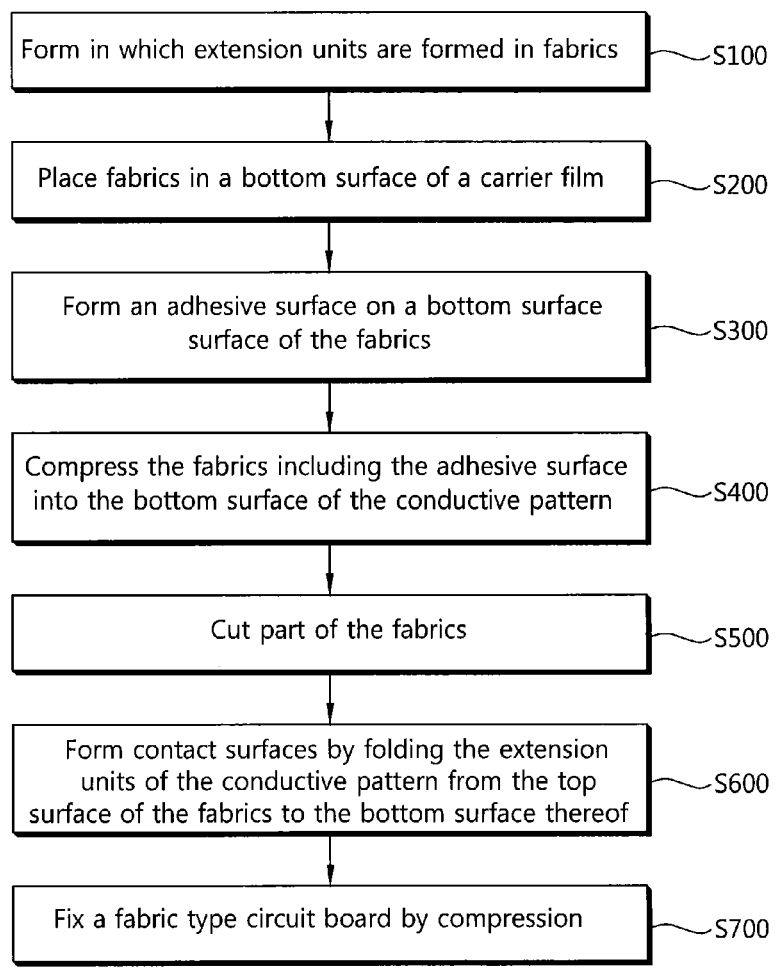
FIG. 2 is a block diagram showing the method of manufacturing the fabric type circuit board according to the first embodiment.

FIG. 1A is a diagram showing a stack step in a method of manufacturing a fabric type circuit board according to a first embodiment, FIG. 1B is a diagram showing a fabric cutting step in the method of manufacturing a fabric type circuit board according to the first embodiment, FIG. 1C is a diagram showing a fabric type circuit board according to a first embodiment, and FIG. 2 is a block diagram showing the method of manufacturing the fabric type circuit board according to the first embodiment.

As shown in FIGS. 1 and 2, the method of manufacturing the fabric type circuit board according to the first embodiment may include forming a conductive pattern at step S100, performing stacking at step S200, forming an adhesive surface at step S300, performing compression at step S400, cutting fabrics at step S500, forming contact surfaces at step S600, and performing fixing at step S700.

At step S100, a conductive pattern 120 is formed on a bottom surface of a carrier film by using a copper film transfer printing scheme. Here, the extension units 120a of the conductive pattern 120 have a length 1.5 to 2 times longer than the extension units of the existing conductive pattern so that the extension units 120a can be folded from a top surface of fabrics 110 to a bottom surface thereof.

At step S200, the fabrics 110 are placed so that they face a bottom surface of a carrier film 130 on which the conductive pattern 120 is formed. Here, a heat-resistant adhesive film 140 is placed between the conductive pattern 120 and the fabrics 110. Furthermore, the fabrics 110 may have the same width as the carrier film 130.

At step S300, an adhesive surface 150 (see FIG. 1A) is formed on a bottom surface of the fabrics 110 on a top surface of which the conductive pattern 120 will be formed. At step S300, a thermosetting adhesive may be used in the bottom surface of the fabrics 110 as the adhesive surface 150. For example, the thermosetting adhesive may have at least one of a liquid state and a film state. Furthermore, the adhesive surface 150 may be formed by laminating the fabrics 110 and a thermosetting adhesive film or coating a thermosetting adhesion agent on the fabrics 110 using specific heat and pressure. Here, the adhesive surface 150 may be selectively formed on the entire surface or on a part of the fabrics 110 according to purposes.

Furthermore, acrylic, urethane, polyester, and polyamide-varnish may be selectively used as the heat-resistant adhesive film 140 and the thermosetting adhesive depending on the type and weaving method of the fabrics 110.

At step S400, the conductive pattern 120 formed on the carrier film 130 is compressed into the fabrics 110 having the adhesive surface 150 formed on the bottom surface thereof. At step S400, a press device may be used, and the compression task is performed in temperature at which the fabrics 110 are not damaged. For example, at step S400, the intermediate product of a fabric type circuit board 100 may be formed by thermally compressing the conductive pattern 120 and the fabrics 110 in temperature of 160 to 200° C. for about 40 minutes. Next, the intermediate product of the fabric type circuit board 100 may be formed by removing the carrier film 130 placed on the top surface of the conductive pattern 120.

At step S500, the fabrics 110 of the intermediate product of the fabric type circuit board 100 formed at step S400 are partially cut (see FIG. 1B). At step S500, only the fabrics 110 may be partially cut by using a cutting device, such as a laser, without damaging the conductive pattern 120. For example, at step S500, a part of the fabrics 110 where the extension units 120a are placed may be cut along incision lines 110a. Accordingly, the extension units 120a can be easily folded along the incision lines 110a of the fabrics 110, and the position of the extension units 120a and an interval between the extension units 120a can be prevented from being deformed.

At step S600, contact surfaces are formed by folding the extension units 120a from the top surface of the fabrics 110 to the bottom surface thereof. Referring to FIG. 1C, (A) is a plan view of the fabric type circuit board 100, and (B) is rear view of the fabric type circuit board 100. The extension units 120a shown in the rear view may be defined as the contact surfaces which enable the fabric type circuit board 100 to easily come in contact with another fabric type circuit board. Furthermore, at step S600, the length of parts of the extension units 120a that are placed in the top surface or the bottom surface of the fabrics 110 may be controlled according to purposes.

At step S700, the extension units 120a are fixed to the adhesive surface 150 formed in the bottom surface of the fabrics 110 by using specific heat and pressure. Accordingly, the complete product of the fabric type circuit board 100 may be formed.

A method of manufacturing a fabric type circuit board according to another embodiment is described in detail below with reference to the accompanying drawings. Similar elements to those in the method of manufacturing the fabric type circuit board described above are assigned the same reference numerals, and a detailed description thereof is omitted. Accordingly, in the following description, elements whose detailed description may be understood with reference to the accompanying drawings.

Figure 3A:
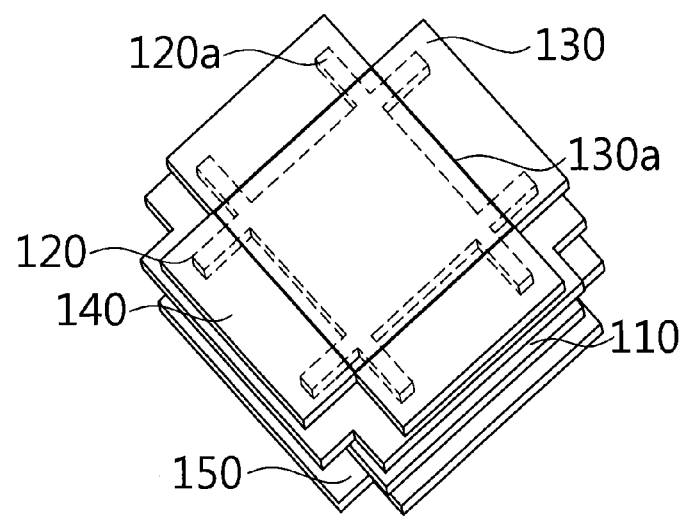
FIG. 3A is a diagram showing a stack step in a method of manufacturing a fabric type circuit board according to a second embodiment.
Figure 3B:
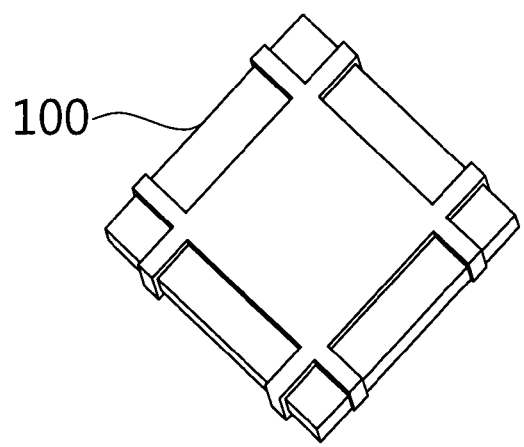
FIG. 3B is a diagram showing a fabric type circuit board according to a second embodiment.
Figure 4:
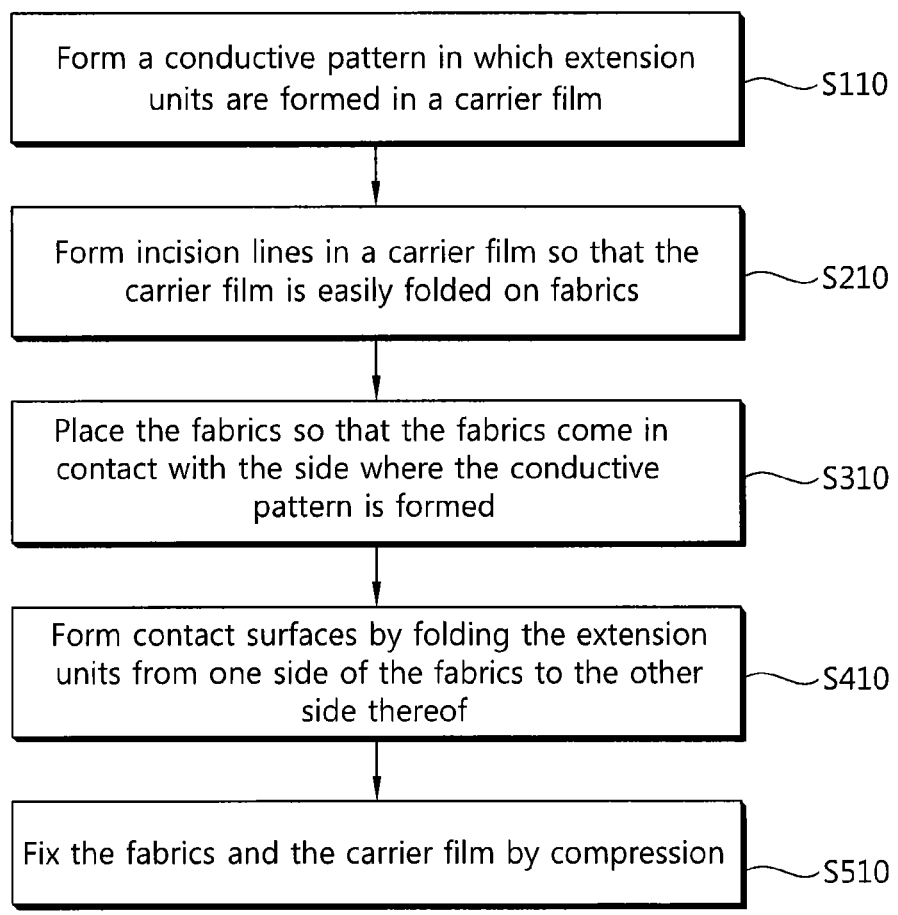
FIG. 4 is a block diagram showing the method of manufacturing the fabric type circuit board according to the second embodiment.

FIG. 3A is a diagram showing a stack step in a method of manufacturing a fabric type circuit board according to a second embodiment, FIG. 3B is a diagram showing a fabric type circuit board according to a second embodiment, and FIG. 4 is a block diagram showing the method of manufacturing the fabric type circuit board according to the second embodiment.

Figure 3B:
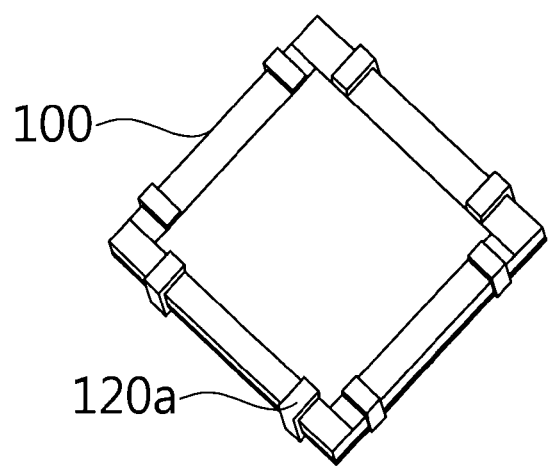

As shown in FIGS. 3 and 4, the method of manufacturing the fabric type circuit board according to the second embodiment may include forming a conductive pattern at step S110, performing cutting at step S210, performing stacking at step S310, forming contact surfaces at step S410, and performing compression at step S510.

At step S110, a conductive pattern 120 is formed in a carrier film 130 by using a copper film transfer printing scheme. Here, the extension units 120a of the conductive pattern 120 have a length 1.5 to 2 times longer than the extension units of the existing conductive pattern so that the extension units 120a are folded from a top surface of fabrics 110 to a bottom surface thereof.

At step S210, a part of the carrier film 130 on which the conductive pattern 120 is formed is cut. For example, at step S210, a part of the carrier film 130 may be cut along incision lines 130a so that the carrier film 130 is easily folded on the fabrics 110. Accordingly, the carrier film 130 can be easily folded along the incision lines 130a, and the position of the extension units 120a can be prevented from being deformed when the extension units 120a are folded.

Furthermore, the length of parts of the extension units 120a that are placed in the top surface or the bottom surface of the fabrics 110 may be controlled according to purposes. At step S210, a part of the carrier film 130 may be easily cut by using a cutting device, such as a laser, so that the conductive pattern 120 is not damaged (see FIG. 3A).

At step S310, the fabrics 110 are placed in the bottom surface of the carrier film 130 on which the conductive pattern 120 is formed. Here, a heat-resistant adhesive film 140 is placed between the conductive pattern 120 and the fabrics 110, and an adhesive surface 150 is placed in the backside of the fabrics 110. Furthermore, the fabrics 110 have a narrower width than the carrier film 130. Here, the width of the fabrics 110 may be identical with a width including the extension units 120a of the conductive pattern 120.

At step S410, contacts surfaces are formed by folding the extension units 120a from the top surface of the fabrics 110 to the bottom surface thereof. Referring to FIG. 3B, (A) is a plane view of a fabric type circuit board 100, and (B) is a rear view of the fabric type circuit board 100. Furthermore, at step S410, the length of parts of the extension units 120a that are placed in the top surface or the bottom surface of the fabrics 110 may be controlled according to purposes.

At step S510, the conductive pattern 120 compresses the fabrics 110 placed from the top surface to the bottom surface. At step S510, a press device may be used, and the compression task is performed in temperature at which the fabrics 110 are not damaged. For example, the conductive pattern 130 and the fabrics 110 may be compressed in temperature of 160 to 200° C. for about 40 minutes. Next, the complete product of the fabric type circuit board 100 may be formed by removing the carrier film 130 formed in the top surface of the conductive pattern 120.

An embodiment in which fabric type circuit boards are coupled according to the present invention is described in detail below.

Figure 5:
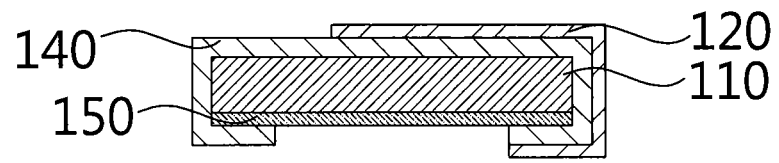
FIG. 5 is a cross-sectional view of the fabric type circuit board according to the first and second embodiments.
Figure 6:
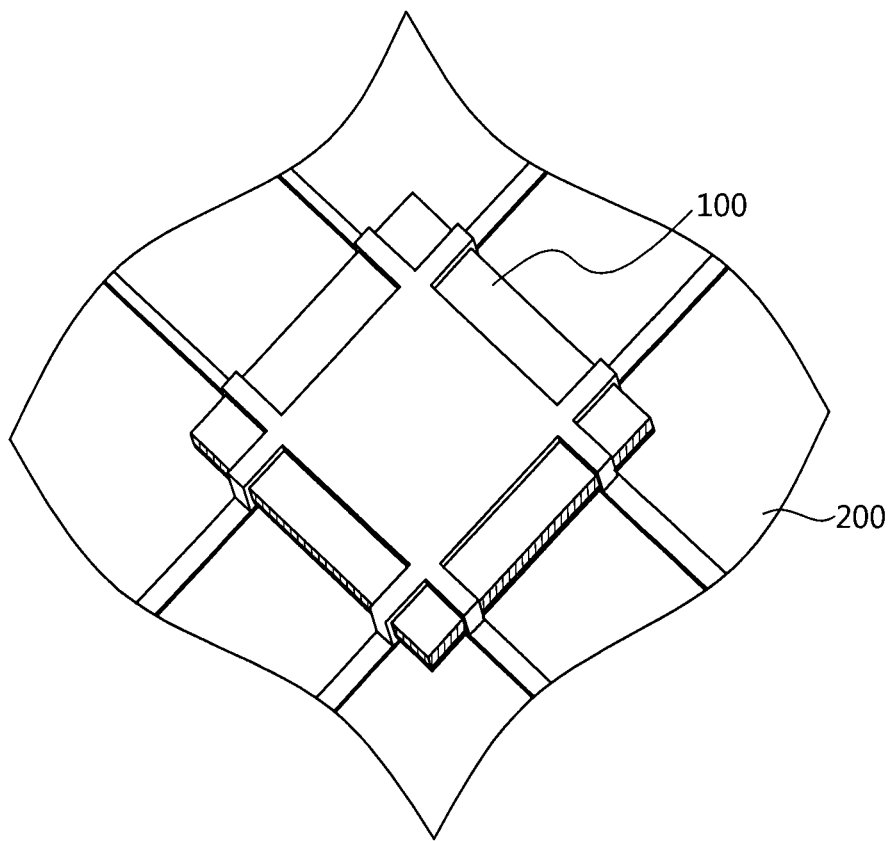
FIG. 6 is a diagram showing the connection of the fabric type circuit board according to the first and second embodiments.

FIG. 5 is a cross-sectional view of the fabric type circuit board according to the first and second embodiments, and FIG. 6 is a diagram showing the connection of the fabric type circuit board according to the first and second embodiments.

As shown in FIGS. 5 and 6, the fabric type circuit board 100 according to the first and second embodiments may be connected to another circuit board 200.

For example, a worker may selectively coat a common solder or a thin film solder on the extension units 120a placed in the bottom surface of the fabric type circuit board 100. Next, a worker may bring the fabric type circuit board 110 into contact with one side of another circuit board 200 and then perform a thermal compression task. Accordingly, the solder coated on the extension units 120a is melted by heat, thus connecting the fabric type circuit board 110 and another circuit board 200.

For another example, a worker may use an anisotropic conductive film. A worker may attach the anisotropic conductive film to a bottom surface of the fabric type circuit board 100. Next, a worker may bring the fabric type circuit board 100 into contact with one side of another circuit board 200 and then perform a thermal compression task. Accordingly, the fabric type circuit board 100 may be connected to another circuit board 200 as the solder balls of the anisotropic conductive film burst.

The fabric type circuit board and the method of manufacturing the same according to the present invention are advantageous in that a reduction of flexibility at the circuit connection part can be prevented by using a conductive adhesive (e.g., a solder and a conductive bond) to a minimum.

Furthermore, the fabric type circuit board and the method of manufacturing the same according to the present invention are advantageous in that a success of connection and electrical conductivity are improved because connection parts between circuits directly come in contact with each other.

Technical objects of the present invention are not limited to the above-described object and other technical objects that have not been described above will become evident to those skilled in the art from the following description.

The embodiments of the present invention described above and shown in the drawings should not be construed as limiting the technical spirit of the present invention. The scope of the present invention is restricted by only the claims, and a person having ordinary skill in the art to which the present invention pertains may improve and modify the technical spirit of the present invention in various forms. Accordingly, the modifications and modifications will fall within the scope of the present invention as long as they are evident to those skilled in the art.

What is claimed is:

1. A method of manufacturing a fabric type circuit board, comprising:
    forming a conductive pattern, having extension units formed therein, to one side of a carrier film;
    placing fabrics so that the fabrics come in contact with a face where the conductive pattern is formed; and
    forming contact surfaces by folding only the extension units from one side of the fabrics to another side of the fabrics.

2. The method as claimed in claim 1, further comprising forming incision lines in the carrier film so that the carrier film is easily folded to the fabrics, before forming the contact surfaces.

3. The method as claimed in claim 1, wherein the conductive pattern is formed by a copper film transfer printing scheme.

4. The method as claimed in claim 1, further comprising compressing the carrier film and the fabrics, after forming the contact surfaces.

5. The method as claimed in claim 4, wherein the fabrics are thermally compressed in temperature at which the fabrics are not thermally deformed.

6. The method as claimed in claim 1, further comprising removing the carrier film from the fabrics, after forming the contact surfaces.

* * * * *